US008855332B2

(12) United States Patent
Choi et al.

(10) Patent No.: US 8,855,332 B2
(45) Date of Patent: Oct. 7, 2014

(54) SOUND ENHANCEMENT APPARATUS AND METHOD

(75) Inventors: Jung-Woo Choi, Hwaseong-si (KR); Jung-Ho Kim, Yongin-si (KR); Young-Tae Kim, Seongnam-si (KR); Sang-Chul Ko, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 612 days.

(21) Appl. No.: 12/957,474

(22) Filed: Dec. 1, 2010

(65) Prior Publication Data

US 2011/0135115 A1 Jun. 9, 2011

(30) Foreign Application Priority Data

Dec. 9, 2009 (KR) ........................ 10-2009-0121895

(51) Int. Cl.
*H03G 3/00* (2006.01)
*H04S 7/00* (2006.01)

(52) U.S. Cl.
CPC ............. *H04S 7/307* (2013.01); *H04S 2420/07* (2013.01); *H04S 2400/09* (2013.01)
USPC .............................. 381/107; 381/61; 381/104

(58) Field of Classification Search
None
See application file for complete search history.

(56) References Cited

U.S. PATENT DOCUMENTS

| | | | | |
|---|---|---|---|---|
| 5,737,432 | A * | 4/1998 | Werrbach | 381/94.1 |
| 5,930,373 | A | 7/1999 | Shashoua et al. | |
| 6,134,330 | A | 10/2000 | De Poortere et al. | |
| 7,333,930 | B2 | 2/2008 | Baumgarte | |
| 2006/0098827 | A1 | 5/2006 | Paddock et al. | |
| 2006/0159283 | A1 | 7/2006 | Mathew et al. | |
| 2008/0091416 | A1 * | 4/2008 | Kim et al. | 704/200.1 |
| 2008/0126081 | A1 | 5/2008 | Geiser et al. | |
| 2008/0130915 | A1 | 6/2008 | Shimura et al. | |
| 2009/0060236 | A1 * | 3/2009 | Johnston et al. | 381/304 |
| 2009/0141907 | A1 | 6/2009 | Kim et al. | |

FOREIGN PATENT DOCUMENTS

| | | |
|---|---|---|
| CN | 1568502 A | 1/2005 |
| JP | 2006-222670 | 8/2006 |
| JP | 2008-103880 | 5/2008 |

(Continued)

OTHER PUBLICATIONS

Chinese Office Action issued Jun. 24, 2014 in counterpart Chinese Patent Application No. 201010563196.7 (12 pages, in Chinese with English Translation).

*Primary Examiner* — Joseph Saunders, Jr.
*Assistant Examiner* — James Mooney
(74) *Attorney, Agent, or Firm* — NSIP Law

(57) ABSTRACT

A sound enhancement apparatus and method which produce low IMD over a broadband frequency region and performs BSE to offer a sound which is natural to the human ears, are provided. The sound enhancement apparatus includes a preprocessor, a BSE signal generator, and a gain controller. The preprocessor divides a source signal into a high-frequency signal and a low-frequency signal and analyzes the low-frequency signal to obtain prediction information regarding a degree of distortion that will be generated by the low-frequency signal. The BSE signal generator generates a higher harmonic signal for the low-frequency signal as a BSE signal to be substituted for the low-frequency signal, wherein the order of the higher harmonic signal is adjusted based on the prediction information regarding the degree of distortion. The gain controller adjusts a synthesis ratio of the low-frequency signal and the BSE signal adaptively depending on the prediction information regarding the degree of distortion.

34 Claims, 11 Drawing Sheets

(56) References Cited

FOREIGN PATENT DOCUMENTS

| | | |
|---|---|---|
| KR | 10-2006-0083318 | 7/2006 |
| KR | 10-2009-0056598 | 6/2009 |
| KR | 10-2009-0058224 | 6/2009 |
| WO | WO 2009/030235 | 3/2009 |

* cited by examiner

SOUND ENHANCEMENT APPARATUS AND METHOD

CROSS-REFERENCE TO RELATED APPLICATION(S)

This application claims the benefit under 35 U.S.C. §119 (a) of Korean Patent Application No. 10-2009-0121895, filed on Dec. 9, 2009, the entire disclosure of which is incorporated herein by reference for all purposes.

BACKGROUND

1. Field

The following description relates to sound processing, and more particularly, to an apparatus and method for providing a natural auditory environment using psychoacoustic effects.

2. Description of the Related Art

Recently, with the progressive development of electronic equipment, such as TVs, home theater systems, slimline mobile phones, and the like, the demand for compact loudspeakers has increased. However, most compact loudspeakers have limitations in the frequency range of sound that they can generate due to their lack of size. In particular, compact speakers have a problem with sound quality deterioration in intermediate to low frequency regions.

Along with the demands for compact speakers, there is an increasing interest in “personal sound zone” technology that transfers sound to a specific listener without utilizing earphones or headsets. This technology prevents noise pollution to adjacent persons. A personal sound zone may be implemented using the direction at which sound is output from a speaker. The direction of sound may be generated by passing sound signals through functional filters such as time delay filters to create sound beams, thereby concentrating sound in a particular direction or in a particular position. However, an existing speaker structure is usually composed of a plurality of speakers and requires miniaturization of the individual loudspeakers, which is a factor that limits frequency band availability.

SUMMARY

In one general aspect, there is provided a sound enhancement apparatus comprising a preprocessor to divide a source signal into a high-frequency signal and a low-frequency signal and to analyze the low-frequency signal to obtain prediction information regarding a degree of distortion that will be generated by the low-frequency signal, a BSE signal generator to generate a higher harmonic signal for the low-frequency signal as a BSE signal to be substituted for the low-frequency signal, wherein the order of the higher harmonic signal is adjusted based on the prediction information regarding the degree of distortion, and a gain controller to adjust a synthesis ratio of the low-frequency signal and the BSE signal adaptively based on the prediction information regarding the degree of distortion.

The processor may classify the low-frequency signal according to a plurality of sub-bands, and may obtain the prediction information regarding a degree of distortion that will be generated by a signal corresponding to each sub-band.

The prediction information regarding the degree of distortion may include tonality information and envelope information.

The BSE signal generator may adjust the amplitude of signals corresponding to the sub-bands to be uniform using the envelope information to generate a normalized signal, and may generate a higher harmonic signal as the BSE signal for the normalized signal adaptively based on the tonality information.

The BSE signal generator may comprise a first adjusting unit to adjust the amplitudes of the signals corresponding to the sub-bands to be uniform using the envelope information, to generate the normalized signal, a second adjusting unit to multiply the normalized signal by the tonality information, and a non-linear device to generate a higher harmonic signal as the BSE signal for the signal multiplied by the tonality information.

The sound enhancement apparatus may further comprise a spectral sharpening unit to perform spectral sharpening on a signal with high tonality from among signals output from the second adjusting unit, wherein the non-linear device generates a higher harmonic signal for the spectral-sharpened signal.

If the low-frequency signal is determined to have low tonality based on the tonality information, the gain controller may adjust the synthesis ratio of the low-frequency signal to the BSE signal such that a portion of the low-frequency signal is larger than that of the BSE signal, thus generating a gain-adjusted signal.

The gain controller may amplify a sound pressure of the BSE signal to be above a masking level of the high-frequency signal such that loudness of the BSE signal is not masked by the high-frequency signal.

The sound enhancement apparatus may further comprise a postprocessor to synthesize the high-frequency signal with the gain-adjusted signal.

The postprocessor may comprise a beam former to process the synthesized signal to form a radiation pattern when the synthesized signal is output, and a speaker array to output the processed signal.

In another aspect, there is provided a sound enhancement method comprising dividing a source signal into a high-frequency signal and a low-frequency signal and analyzing the low-frequency signal to obtain prediction information regarding a degree of distortion that will be generated by the low-frequency signal, generating a higher harmonic for the low-frequency signal as a BSE signal to be substituted for the low-frequency signal, wherein an order of the higher harmonic is adjusted based on the prediction information regarding the degree of distortion, and adjusting a synthesis ratio of the low-frequency signal and the BSE signal adaptively depending on the prediction information regarding the degree of distortion.

The generating of the prediction information regarding the degree of distortion may comprise classifying the low-frequency signal according to a plurality of sub-bands, and obtaining prediction information regarding a degree of distortion that will be generated by a signal corresponding to each sub-band.

The prediction information regarding the degree of distortion may include tonality information and envelope information.

The generating of the order of the higher harmonic signal may comprise adjusting amplitudes of signals corresponding to the sub-bands to be uniform using the envelope information, to generate a normalized signal, and generating a higher harmonic signal for the normalized signal adaptively depending on the tonality information.

The generating of the higher harmonic signal for the normalized signal adaptively depending on the tonality information may comprise multiplying the normalized signal by the tonality information, performing spectral sharpening on a signal with high tonality from among signals multiplied by the tonality information, and generating a higher harmonic signal for the spectral-sharpened signal as the BSE signal.

If the low-frequency signal is determined to have low tonality based on the tonality information, the adjusting of the synthesis ratio of the low-frequency signal and the BSE signal may comprise adjusting the synthesis ratio of the low-frequency signal to the BSE signal such that a portion of the low-frequency signal is larger than that of the BSE signal, thus generating a gain-adjusted signal.

The adjusting of the synthesis ratio of the low-frequency signal and the BSE signal may further comprise amplifying a sound pressure of the BSE signal to exceed a masking level of the high-frequency signal such that the BSE signal is not masked by the high-frequency signal.

The sound enhancement method may further comprise synthesizing the high-frequency signal with the gain-adjusted signal.

The synthesizing of the high-frequency signal with the gain-adjusted signal may further comprise processing the synthesized signal to form a predetermined radiation pattern when the synthesized signal is output.

In another aspect, provided is a sound processing apparatus comprising a processor to divide a source signal into a high-frequency signal and low-frequency signal and to obtain prediction information that includes a predicted degree of distortion that will be generated by the low-frequency signal, an adaptive harmonic signal generator to generate a higher harmonic signal in substitution of a portion of the low-frequency signal based on the predicted degree of distortion of the low-frequency signal, and a gain controller to adjust a conversion ratio of the portion of the low-frequency signal into the higher harmonic signal adaptively to reduce an unequal amount of harmonics, and to generate a gain-adjusted low-frequency signal.

The processor may comprise a low-pass filter, a multi-band splitter, and a distortion prediction information extractor.

The multi-band splitter may divide the low-frequency signal into a plurality of sub-bands and the distortion prediction information extractor may obtain distortion prediction information for each of the sub-bands.

The distortion prediction information extractor may obtain tonality and envelope information for each of the sub-bands.

The adaptive harmonic signal generator may generate a higher harmonic signal by adjusting an order of the higher harmonic signal based on the predicted degree of distortion of the low-frequency signal The sound processing apparatus of claim 20, wherein the gain controller adjusts a synthesis ratio of the low-frequency signal and the generated higher harmonic signal adaptively, based on the predicted degree of distortion of the low-frequency signal.

The gain controller may comprise a gain processor to adjust a synthesis ratio of a low-frequency signal and the generated higher harmonic signal, adaptively.

The gain processor may adjust a synthesis ratio of a low-frequency signal and the generated higher harmonic signal, adaptively, based on the tonality information.

The gain controller may further comprise another gain processor to adjust a gain of the higher harmonic signal depending on the characteristics of a high-frequency signal.

The sound processing apparatus may further comprise another processor to output the high-frequency signal with the synthesized the low-frequency signal and the generated higher harmonic signal.

The processor may comprise a beam former to process the synthesized signal to form a radiation pattern when the synthesized signal is output, and a speaker array to output the processed signal.

Other features and aspects may be apparent from the following description, the drawings, and the claims.

BRIEF DESCRIPTION OF THE DRAWINGS

Throughout the drawings and the description, unless otherwise described, the same drawing reference numerals should be understood to refer to the same elements, features, and structures. The relative size and depiction of these elements may be exaggerated for clarity, illustration, and convenience.

DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein may be suggested to those of ordinary skill in the art. Also, descriptions of well-known functions and constructions may be omitted for increased clarity and conciseness.

The phenomenon in which a listener hears bass sound through higher harmonics is referred to as "virtual pitch" or "missing fundamental" in the field of psychoacoustics. This is the phenomenon in which sound with a frequency ω has the same or similar pitch as sound composed of only the higher harmonics (2ω, 3ω, 4ω, . . . ). A technology of utilizing the virtual pitch or missing fundamental to offer an auditory sense similar to bass sound without actually having to produce such a bass sound is referred to as "Psychoacoustic Bass Enhancement (BSE)".

Generally, higher harmonic signals are produced by non-linear devices. However, existing non-linear devices for generating higher harmonic signals often produce unnecessary non-harmonic frequency components upon generating higher harmonic components. These non-harmonic frequency components cause inter-modulation distortion (IMD). When IMD has a magnitude greater than or equal to a pure tone the IMD can become a contributing factor in the deterioration of sound quality.

When BSE is applied over a broadband frequency region where various spectrums of sound components exist, a great amount of IMD may be generated. The higher the order of a harmonic signal with respect to source sound that is generated, the greater IMD appears. Accordingly, the higher the order of a harmonic signal that is used to further increase a virtual pitch, the more significant the sound quality deterioration becomes.

Figure 1:
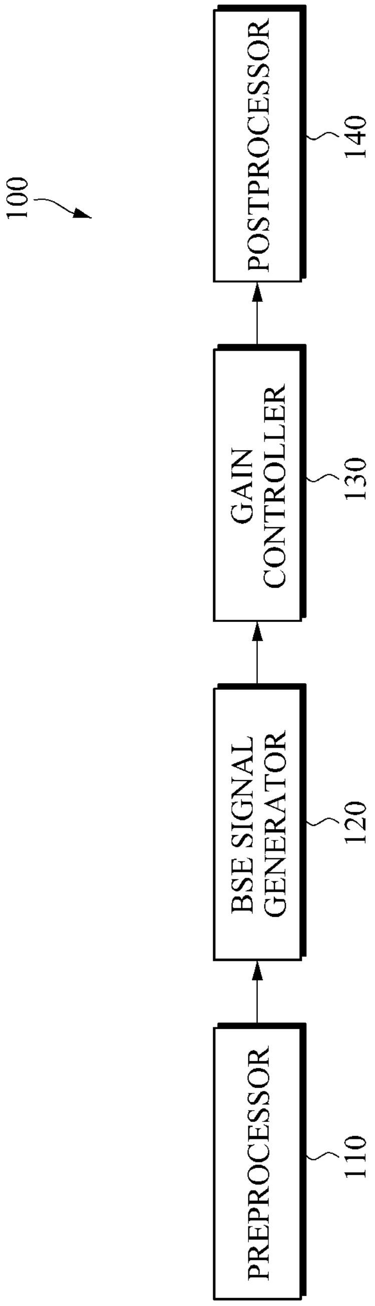
FIG. 1 is a diagram illustrating an example of a sound enhancement apparatus.

FIG. 1 illustrates an example of a sound enhancement apparatus.

Referring to FIG. 1, sound enhancement apparatus 100 includes a preprocessor 110, a BSE signal generator 120, a gain controller 130, and a postprocessor 140. The sound enhancement apparatus 100 may further include a speaker array (not shown). The preprocessor and the postprocessor may be the same processor. The preprocessor 110 divides received signals into high-frequency signals and low-frequency signals, and analyzes each low-frequency signal to obtain prediction information about the degree of distortion that will be generated by the low-frequency signal. For example, the low-frequency signals may be signals in frequency regions excluding high-frequency regions. The low-frequency signals may also include intermediate-frequency signals. The low-frequency signals may be signals over a frequency range that is broader than a frequency range that can be processed by general sub-woofers.

For example, the frequency ranges may be based on the perception of virtual pitch (pitch strength). The stronger the estimated pitch strength represents a strong perception of the original pitch only with its own harmonics. For example, frequency components below 250 Hz may be determined to have a strong pitch strength (i.e. low frequency signals). However, this pitch strength is merely for purposes of example, and the sound enhancement apparatus is not limited thereto. As described herein, frequency components with a strong pitch strength may be replaced by higher harmonics.

The preprocessor 110 may classify the low-frequency signals into predetermined sub-bands, and extract tonality information and envelope information from each sub-band, in units of frames. The tonality information and/or the envelop information may be used to predict the degree of distortion that will be generated from the signal of each sub-band after a non-linear operation is performed on each sub-band. The envelop information may include, for example, the energy of a signal, the loudness of a signal, and the like.

The BSE signal generator 120 may generate a higher harmonic signal for the low-frequency signal by adjusting the order of the signal based on the prediction information that includes the predicted degree of distortion that will be generated by the signal. For example, the BSE signal generator 120 may generate an adaptive harmonic signal based on the tonality information and the envelop information of each sub-band. Based on the predicted distortion that will be caused by the sub-band, the BSE signal generator 120 may adjust the order of the higher harmonic signal that is to be substituted for the sub-band.

The BSE signal generator may receive the divided sound signal, and analyze and predict the amount of distortion the low-frequency signal will produce if it is subjected to a non-linear operation. Based on the predicted amount of distortion, the BSE signal generator 120 may adaptively control the gain of each sub-band, such that the sub-bands with little chance of distortion produce harmonics up to higher order. Different gain control for each sub-band may result in unequal amount of harmonics across the frequency bands. To compensate for this, the mixing ratio of the generated harmonics and the original sub-band signal may be changed.

The higher the order of a harmonic signal that is used to further increase a virtual pitch, the more significant the sound quality deterioration becomes. Therefore, a sub-band predicted to cause a higher degree of distortion may be adjusted to a harmonic signal having a lower envelope and a lower order and a sub-band predicted to cause a lower degree of distortion may be adjusted to a harmonic signal having a higher envelope and a higher order. In doing so, the BSE signal generator is able to avoid sub-bands that cause distortion.

The higher harmonic signal is substituted for the low-frequency signal and will hereinafter be referred to as a BSE signal. The BSE signal generator 120 may adjust the higher harmonics adaptively based on tonality information. For example, the BSE signal generator 120 may adjust the higher harmonics based on the spectrum of the sound source and the prediction information regarding the degree of distortion. In addition, the BSE signal generator 120 may perform spectral sharpening on the low-frequency signal to further reduce IMD.

The gain controller 130 may adjust a synthesis ratio of the low-frequency signal and the BSE signal adaptively based on the predicted degree of distortion of the harmonic signal, through gain adjustment, thus creating a gain-adjusted low-frequency signal to be output. For example, the gain controller 130 may adjust a conversation ratio of the low-frequency signal to the BSE signal adaptively based on a desired amount of higher harmonic signals to be generated. A different gain control for each sub-band may result in unequal amount of harmonics across the frequency bands. To compensate for this, the mixing ratio of the generated harmonics and the original sub-band signal may be adaptively adjusted to prevent or reduce an unequal amount of harmonics.

The postprocessor 140 synthesizes the gain-adjusted low-frequency signal with the high-frequency signal. The postprocessor 140 may process the synthesized signal in a manner to form a radiation pattern when the synthesized signal is output, and output the processed signal. For example, the processed signal may be output to a speaker.

Accordingly, by predicting the amount of IMD components and adaptively adjusting the order and amplification factor of a higher distortion harmonic signal, a large amount of low-frequency components may be substituted with high-frequency bands while minimizing sound quality deterioration. In doing so, when the processed signal is applied to compact loudspeakers, low IMD may be ensured over a broadband low-frequency region and BSE signals capable of offering sound that is natural to human ears may be generated.

Figure 2:
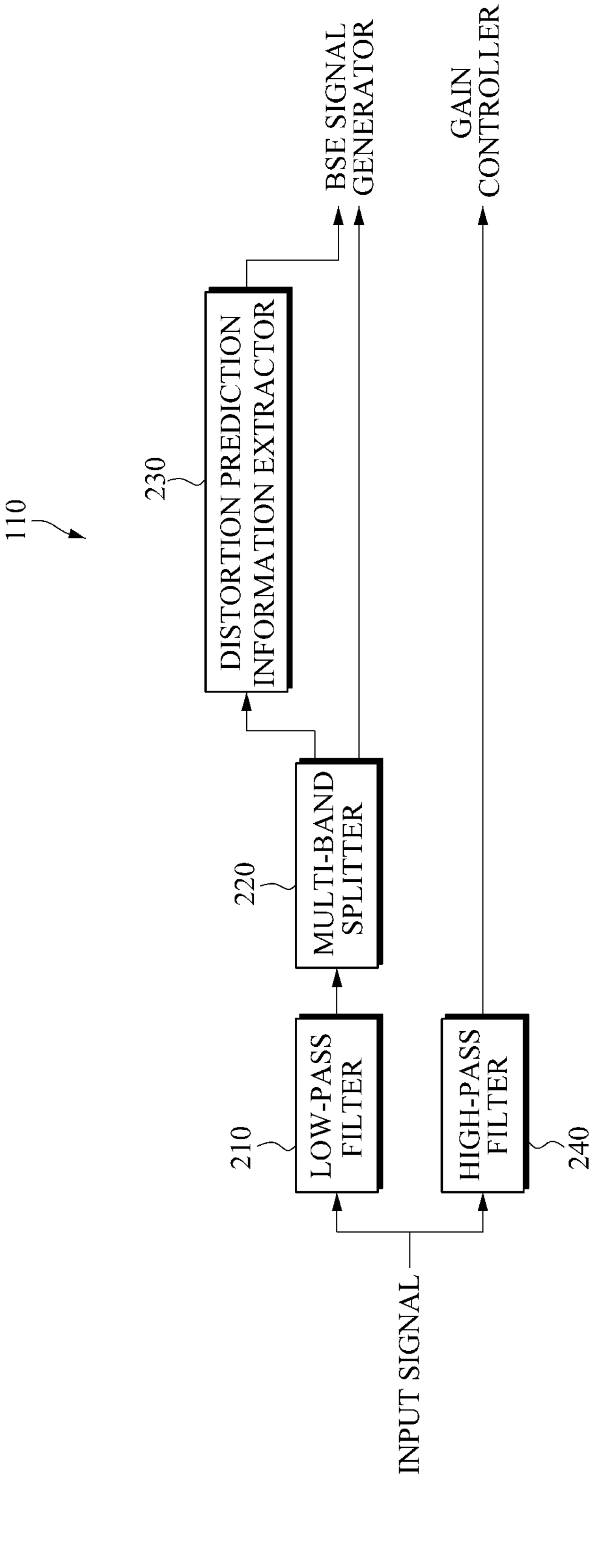
FIG. 2 is a diagram illustrating an example of a preprocessor that may be included in the sound enhancement apparatus illustrated in FIG. 1.

FIG. 2 illustrates an example of a preprocessor that may be included in the sound enhancement apparatus illustrated in FIG. 1.

Referring to FIG. 2, preprocessor 110 includes a low-pass filter 210, a multi-band splitter 220, a distortion prediction information extractor 230, and a high-pass filter 240.

The low-pass filter 210 passes low-frequency (or low and intermediate-frequency) signals from among received signals to generate BSE signals.

The multi-band splitter 220 may classify the low-frequency signals according to sub-bands in order to reduce IMD of the low-frequency signals. This process may be represented as shown below in Equation 1. In this example, the classified sub-band signals may be provided in various formats depending on acoustic characteristics, such as a 1 or a ⅓-octave filters.

$$ORG(t) = \sum_{m=1}^{M} ORG^{(m)}(t) \tag{1}$$

In Equation 1, ORG(t) represents a source signal of a low-frequency signal passed by the low-pass filter 210 and $ORG(t)^{(m)}$ represents a source signal of each sub-band.

By dividing a low-frequency region according to predetermined sub-bands, and by extracting distortion prediction information from a signal belonging to each sub-band, and by performing BSE on the individual sub-band signals, the IMD may be reduced. For example, by performing BSE on the individual sub-band signals, IMD occurs only between frequency components in the same frequency band and does not occur between components in different frequency bands. Accordingly, it is possible to further reduce inter-modulation distortion in comparison to applying BSE to the entire signal.

The distortion prediction information extractor 230 may extract envelope information and a tonality parameter for each signal of the sub-bands, as prediction information that may be used to determine an amount of distortion that will be generated by the signal.

The envelope information may be used to adjust the higher harmonics generated by BSE processing. The tonality information indicates a degree of flatness of each spectrum and may be used to adjust the amount of IMD that is generated.

The BSE may be applied to high-pitched components of a source signal and not to source signals that do not have pitch or signals where excessive IMD occurs. For example, BSE may not be applied to signals that are noise or impulsive sounds that have no pitch and that have a flat spectrum, or signals that are predicted to cause excessive distortion Accordingly, by adjusting the BSE signals generated based on source signals to increase a portion of source sound when a pitch strength is low or when excessive distortion is generated, natural sound may be produced. To distinguish flat spectrums from spectrums with pitched components, tonality of a spectrum may be calculated for each frequency band of each sub-band.

The high-pass filter 240 may pass high-frequency signals from among received signals. No BSE processing may be performed on high-frequency signals.

Figure 3:
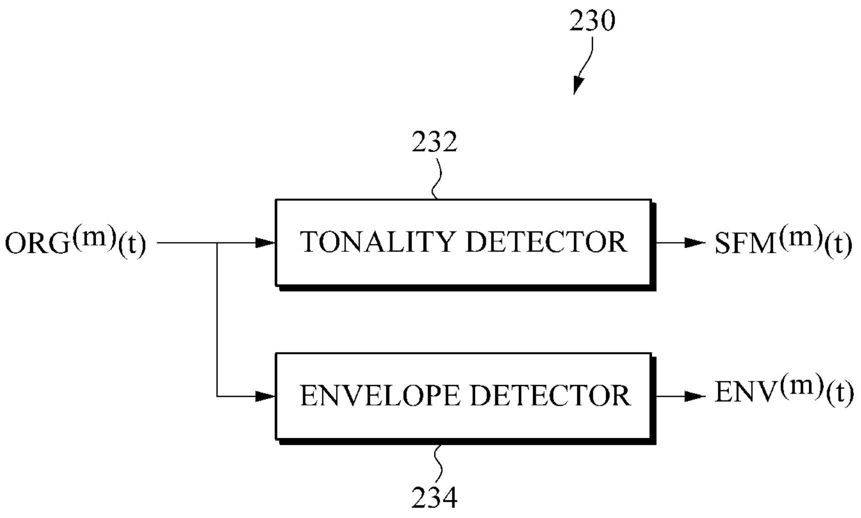
FIG. 3 is a diagram illustrating an example of a distortion prediction information extractor that may be included in the preprocessor illustrated in FIG. 2.

An example distortion prediction information extractor 230 is described in FIG. 3.

FIG. 3 illustrates an example of a distortion prediction information extractor that may be included in the preprocessor illustrated in FIG. 2.

Referring to the example shown in FIG. 3, the distortion prediction information extractor 230 includes a tonality detector 232 and an envelope detector 234.

The tonality detector 232 may detect tonalities, for example, $SFM^{(1)}(t), \ldots, SFM^{(m)}(t)$ for m multi-band signals $ORG^{(1)}(t), \ldots, ORG^{(m)}(t)$. The n-th time frame of the m-th sub-band signal among the m sub-band signals may be denoted by $ORG^{(m,n)}(t)$ for each frequency band. For example, a time frame may be a certain length of a signal at a specific time and the time frames may overlap or partially overlap over time.

In order to distinguish flat spectrums from spectrums with pitch components, tonality of a spectrum may be calculated for a time frame of each frequency band. Tonality indicates how close a signal is to a pure tone and may be defined in various ways, for example, by a spectral flatness measure (SFM) as shown in Equation 2.

$$SFM^{(m,n)} = 1 - \frac{GM(A^{(m,n)}(f))}{AM(A^{(m,n)}(f)} = 1 - \frac{\sqrt[L]{\prod_{l=1}^{L} A^{(m,n)}(l\Delta f)}}{\frac{1}{L}\sum_{l=1}^{L} A^{(m,n)}(l\Delta f)} \tag{2}$$

In this example, $A^{(m,n)}(f)$ represents a frequency spectrum of $ORG^{(m,n)}(t)$. The $A^{(m,n)}(f)$ may be obtained by performing discrete Fourier transform on a discrete frequency $f=l\Delta f$, where l is a constant that is greater than 0. GM represents the geometric mean of the frequency spectrum $A^{(m,n)}(f)$ and AM represents the arithmetic mean of $A^{(m,n)}(f)$. The tonality is "1" when the corresponding signal is a pure tone and the tonality is "0" when the signal is a completely flat spectrum.

The tonality detector 232 may perform interpolation on a tonality measure $SFM^{(m,n)}$ obtained from each time frame and transform the result of the interpolation into a continuous value represented on a time axis. Accordingly, the tonality detector 232 may acquire a continuous signal $SFM^{(m)}(t)$ for each frequency band. The acquired tonality measure may represent a pitch strength of the source signal and a degree of IMD that is predicted to be generated by the source signal. The greater the tonality measure, the stronger the pitch strength and the lower the degree of IMD.

The envelope detector 234 may detect envelope information, for example, $ENV^{(1)}(t), \ldots, ENV^{(m)}(t)$ for the m sub-band signals $ORG^{(1)}(t), \ldots, ORG^{(m)}(t)$.

FIG. 3 illustrates an example where envelope information and tonality information for the m-th frequency band signal $ORG^{(m)}(t)$ are extracted. The tonality detector 232 and envelope detector 234 of the distortion prediction information extractor 230 may include a plurality of tonality detectors and a plurality of envelope detectors based on the number of sub-bands in order to process sub-band signals individually.

Figure 4:
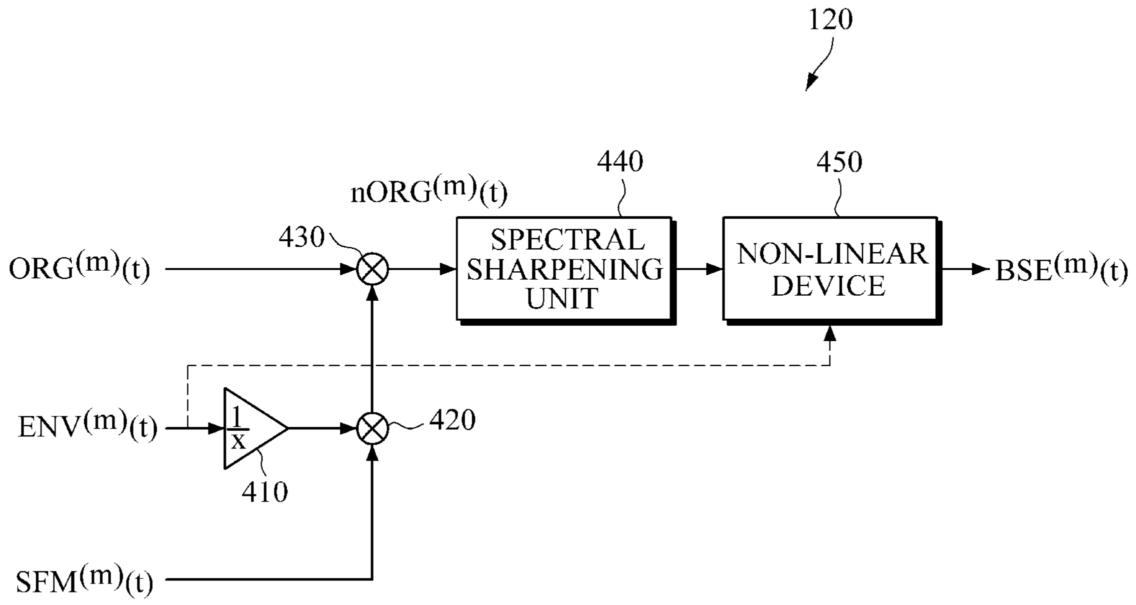
FIG. 4 is a diagram illustrating an example of a psychoacoustic bass enhancement (BSE) signal generator that may be included in the sound enhancement apparatus illustrated in FIG. 1.

FIG. 4 illustrates an example of a BSE signal generator that may be included in the sound enhancement apparatus illustrated in FIG. 1.

BSE signal generator 120 may generate a higher harmonic signal adaptively using the tonality information and envelope information extracted by the distortion prediction information extractor 230 (see FIGS. 2 and 3). The adaptively generated higher harmonic signal is referred to as a BSE signal.

Referring to the example shown in FIG. 4, BSE signal generator 120 includes an envelope information applying unit 410, a first multiplier 420, a second multiplier 430, a spectral sharpening unit 440, and a non-linear device 450.

FIG. 4 illustrates an example where BSE is performed on the m-th sub-band signal $ORG^{(m)}(t)$ for each frequency band. The BSE signal generator 120 may include functional blocks to perform BSE on the plurality of sub-band signals in parallel for each frequency band.

In order to prevent changes in BSE effect due to variations in input amplitude, the peak envelopes of input signals may be made uniform before the BSE processing is performed. For example, to prevent the higher harmonics generated from changing due to variations in dynamic range, the peak envelopes of input signals may be made uniform before BSE processing.

The envelope information applying unit 410 may convert the peak envelope of an input signal to a value 1/x for normalization. The first multiplier 420 may multiply a signal $ORG^{(m)}(t)$ by the value 1/x in order to make the envelope of the signal $ORG^{(m)}(t)$ uniform.

If a sound signal of a m-th sub-band is $ORG^{(m)}(t)$ and envelope information extracted from the sound signal $ORG^{(m)}(t)$ is $ENV^{(m)}(t)$, the envelope information applying unit 410 and the first multiplier 420 may divide the $ORG^{(m)}(t)$ by the $ENV^{(m)}(t)$ to convert the sound signal to a signal with a unit envelope, thus generating a normalized signal $n'ORG^{(m)}(t)$. This process is expressed below in Equation.

$$n'ORG^{(m)}(t) = \frac{ORG^{(m)}(t)}{ENV^{(m)}(t)} \tag{3}$$

As an example, the extracted signal envelope may be multiplied by the tonality measure and a higher harmonic signal with a higher order tonal component may be generated, and the amplitude of a higher harmonic signal for a flat spectrum may be exponentially reduced. This process is expressed below in Equation 4.

$$nORG^{(m)}(t) = ORG^{(m)}(t) \times \frac{SFM^{(m)}(t)}{ENV^{(m)}(t)} \tag{4}$$

By utilizing this method, it is possible to generate a higher order of harmonics for signals predicted to generate a small amount of IMD and a strong pitch and a lower order of harmonics for signals that are predicted to generate a large amount of IMD.

The second multiplier 430 may multiply the normalized signal $nORG^{(m)}(t)$ by the tonality measure $SFM^{(m)}(t)$. The envelope information applying unit 410, the first multiplier 420, and the second multiplier 430 may include a first adjustment unit in order to make the amplitudes of sub-band signals uniform using envelope information to generate a normalized signal. The envelope information applying unit 410, the first multiplier 420, and the second multiplier 430 may also include a second adjustment unit for multiplying the normalized signal by tonality information.

The non-linear device 450 may generate a higher harmonic signal for a received signal. The non-linear device 450 may be, for example, a multiplier, a clipper, a comb filter, a rectifier, and the like.

The non-linear device 450 may generate a higher harmonic signal for a signal by multiplying the normalized signal $nORG^{(m)}(t)$ by tonality information $SFM^{(m)}(t)$, thereby causing a signal that is predicted to generate a large amount of IMD to have a lower envelope. That is, the non-linear device 450 may generate low orders for higher harmonic signals that are expected to generate a large amount of IMD, thereby avoiding high distortion that may be caused by the higher order harmonics.

Figure 5A:
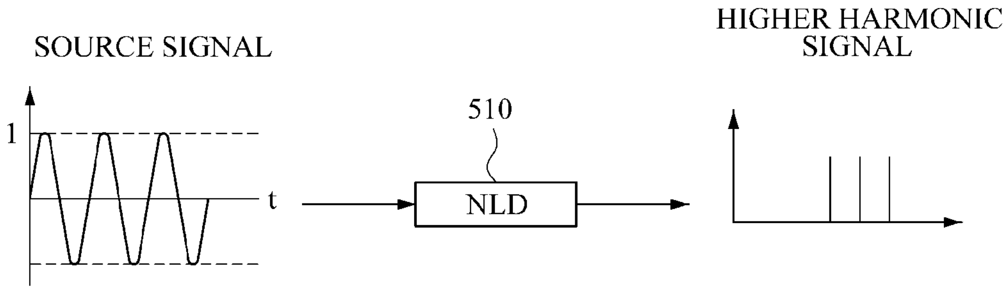
FIGS. 5A and 5B are diagrams illustrating examples of higher harmonic signals that vary according to envelope variations.
Figure 5B:
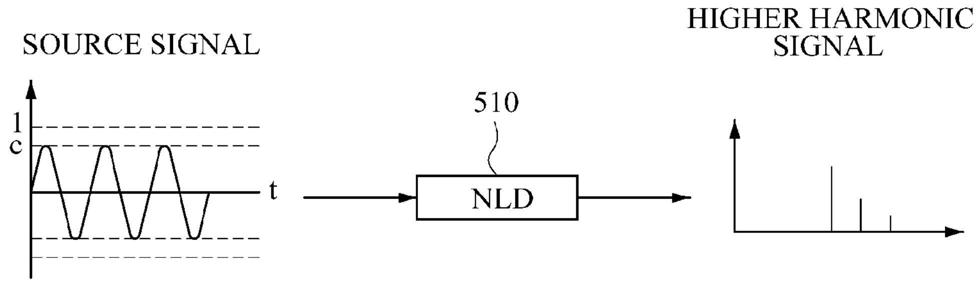

The BSE procedures that are applied based on tonality is described with reference to FIGS. 5A and 5B. FIGS. 5A and 5B also illustrate examples of higher harmonic signals that vary according to envelope variations.

Most BSE processors have an inhomogeneous characteristic together with a non-linear characteristic. In this example, the phrase "inhomogeneous characteristic" refers to the outputs of a BSE processor that do not increase linearly in proportion to amplification of input signals.

In the example shown in FIG. 5A, the non-linear device 510 is a multiplier. When higher harmonics are generated using the multiplier 510 and an input signal is amplified 'c' number of times, a resultant signal obtained after being multiplied 'j' number of times by the multiplier 510 may be expressed as shown below in Equation 5.

$$(c\mathrm{ORG}^{(m)}(t))^j = c^j(\mathrm{ORG}^{(m)}(t))^j \tag{5}$$

As illustrated in FIG. 5A, when an input signal is amplified at an amplification factor of 1 (c=1) and when the signal is input to the non-linear device 510, a uniform amplitude of higher harmonics may be output regardless of the order of the higher harmonics.

However, as illustrated in FIG. 5B, when an input signal is amplified at an amplification factor lower than 1 (c<1) and when the signal is input to the non-linear device 510, the amplitude of higher harmonics may be exponentially reduced based on the higher order of the higher harmonics. In other words, the higher order higher harmonics may have significantly lower amplitude than compared to the lower order higher harmonics.

By utilizing this effect, the non-linear device 510 may adjust the orders of higher harmonics by varying the amplitudes of the higher harmonics.

Referring again to FIG. 4, in order to further reduce IMD, the BSE signal generator 120 may include a spectral sharpening unit 440. The spectral sharpening unit 440 may perform spectral sharpening on signals output from the second multiplier 430 using tonality information.

Figure 6A:
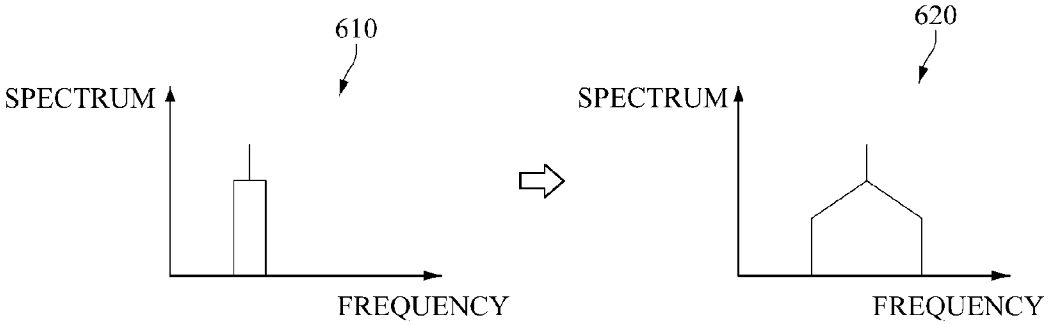
FIG. 6A is a diagram illustrating an example of BSE processing that is performed on a signal where a tonal component and a flat spectrum coexist.
Figure 6B:
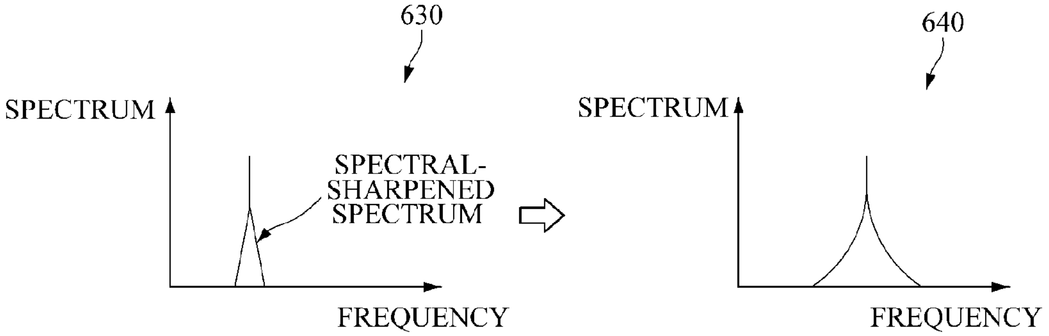
FIG. 6B is a diagram illustrating an example of BSE processing that is performed on a spectral-sharpened signal.

FIG. 6A illustrates an example of BSE processing that is performed on a signal where a tonal component and a flat spectrum coexist, and FIG. 6B illustrates an example of BSE processing that is performed on a spectral-sharpened signal.

As illustrated in FIG. 6A, when a higher harmonic signal is generated for a signal including a flat spectrum and a tonal component that coexist in the same band, IMD between the flat spectrum and tonal component is generated over a broad band (see 620 of FIG. 6A). In order to reduce this phenomenon, spectral sharpening may be performed to pass only a peak component in the spectral domain to reduce a noise-like spectrum. Through the spectral sharpening, only a peak component in the spectrum may be maintained. As shown in FIG. 6B, the IMD is reduced when BSE is applied to a spectral-sharpened signal 630.

Returning again to FIG. 4, the operation of the spectral sharpening unit 440 may be expressed below as shown in Equation 6.

$$A'^{(m,n)}(f) = A^{(m,n)}(f)\frac{|A^{(m,n)}(f)|}{(|A^{(m,n)}(f)| + \alpha)} \tag{6}$$

In Equation 6, α represents a tuning parameter for adjusting a degree of spectral sharpening and may vary in association with a tonality measure. For example, information for spectral sharpening may be tonality information that may be written below as shown in Equation 7.

$$A'^{(m,n)}(f) = A^{(m,n)}(f)\frac{|A^{(m,n)}(f)|}{(|A^{(m,n)}(f)| + \eta SFM^{(m,n)})}, \tag{7}$$

In Equation 7, η represents a degree at which tonality is reflected and may be adjusted by a user.

The spectral sharpening unit 440 may apply spectral sharpening only to signals having high tonality to minimize variations in sound quality. In other words, the spectral sharpening unit 440 may remove or reduce the remaining spectrum components except a peak component from a frequency domain, thus suppressing distortion between a broadband signal and tonality component.

The non-linear device 450 may generate a higher harmonic signal for the spectral-sharpened signal. As denoted by a dotted line of FIG. 4, after generating the BSE signal, the non-linear device 450 may restore the envelope of the BSE signal based on envelope information of the corresponding source signal such that the BSE signal has the envelope of its original low-frequency signal.

Figure 7:
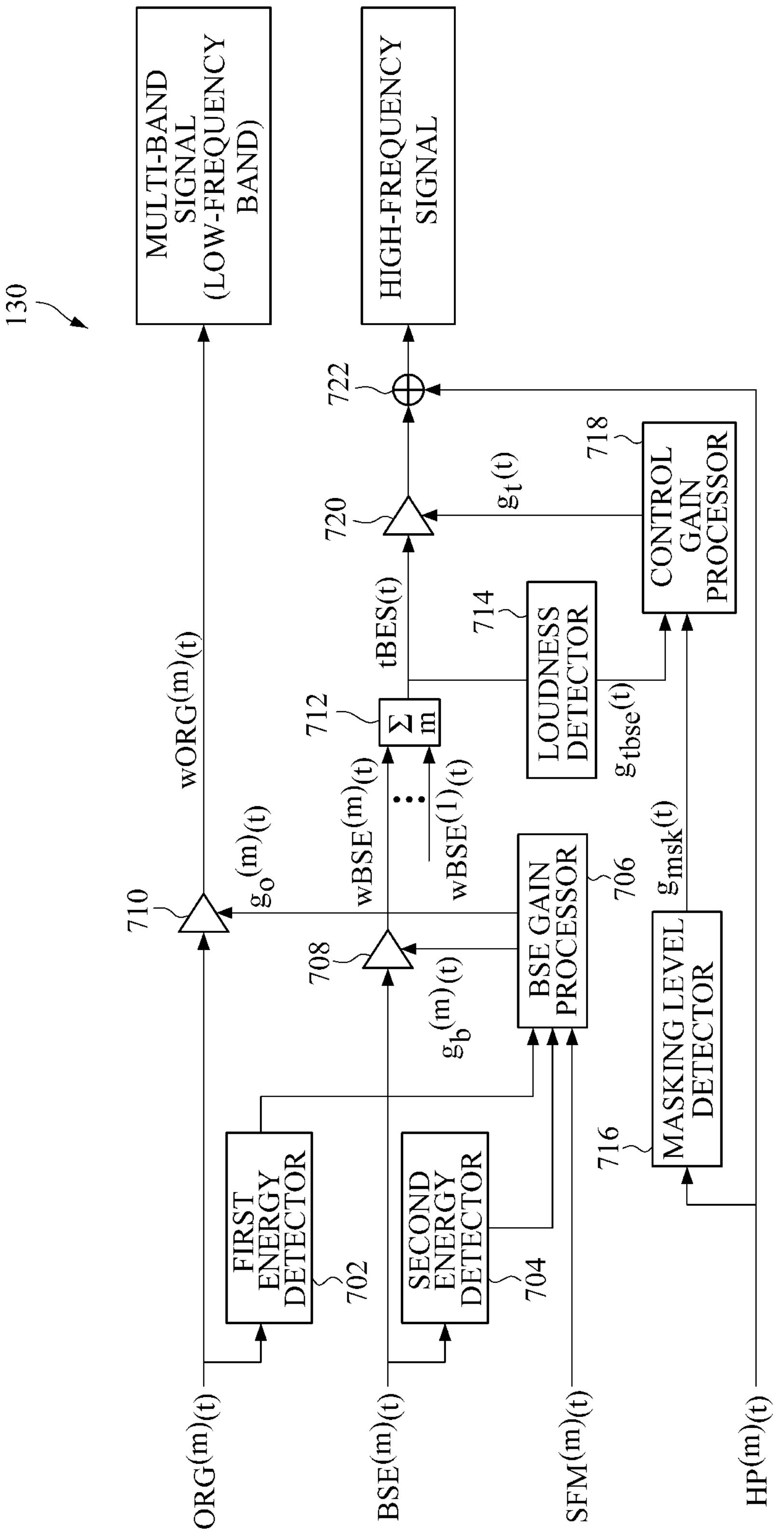
FIG. 7 is a diagram illustrating an example of a gain controller that may be included in the sound enhancement apparatus illustrated in FIG. 1.

FIG. 7 illustrates an example of a gain controller that may be included in the sound enhancement apparatus illustrated in FIG. 1.

In this example, gain controller 130 includes parts 702, 704, 706, 708 and 710 for adjusting a synthesis ratio of a BSE signal and a source signal depending on the amount of IMD predicted, and parts 712, 714, 716, 718, 720 and 722 for adjusting a gain of the BSE signal depending on the characteristics of a high-frequency signal. FIG. 7 illustrates an example where gains of a source signal $ORG^{(m)}(t)$ of a m-th sub-band and a BSE signal $BSE^{(m)}(t)$ of the m-th sub-band are adjusted to synthesize the BSE signal $BSE^{(m)}(t)$ with the source signal $ORG^{(m)}(t)$. The gain controller 130 may further include functional blocks for adjusting gains of source signals and BSE signals of the plurality of sub-bands in parallel.

In order to maintain a low-frequency region of the source signal $ORG^{(m)}(t)$, the loudness of the generated BSE signal $BSE^{(m)}(t)$ may be matched to the source signal $ORG^{(m)}(t)$. A BSE gain processor 706 may adjust a synthesis ratio of a low-frequency signal $ORG^{(m)}(t)$ not subjected to BSE processing and the BSE signal $BSE^{(m)}(t)$ adaptively based on a tonality measure. As such, by increasing a portion of the source signals for signal frames to which no BSE is applied, natural sound with low distortion may be produced.

A first energy detector 702 may detect the loudness $G_{org}^{(m)}(t)$ of the low-frequency component $ORG^{(m)}(t)$ of the source signal. A second energy detector 704 may detect the loudness $G_{bse}^{(m)}(t)$ of the BSE signal $BSE^{(m)}(t)$. Loudness may be calculated, for example, using a Root-Mean-Square (RMS) of a signal, using a loudness meter, and the like.

A BSE gain processor 706 may generate a gain adjustment value $g_o^{(m)}(t)$ of the low-frequency component $ORG^{(m)}(t)$ and a gain adjustment value $g_b^{(m)}(t)$ of the BSE signal $BSE^{(m)}(t)$ using the loudness $G_{org}^{(m)}(t)$ of the low-frequency component $ORG^{(m)}(t)$ and the loudness $G_{bse}^{(m)}(t)$ of the BSE signal $BSE^{(m)}(t)$. For example, the BSE gain processor 706 may generate the gain adjustment values $g_o^{(m)}(t)$ and $g_b^{(m)}(t)$ using the tonality measure SFM extracted by the distortion prediction information extractor 230.

The BSE gain processor 706 may set the gain adjustment value $g_b^{(m)}(t)$ of the BSE signal $BSE^{(m)}(t)$ to be proportional to the tonality and may set the gain adjustment value $g_o^{(m)}(t)$ of the low-frequency component $ORG^{(m)}(t)$ to be inversely-proportional to the tonality. Accordingly, the amount of source signal may be reduced in inverse-proportion to the tonality and the energy corresponding to the reduced amount is replaced by a BSE signal. Therefore, it is possible to enhance performance by increasing a portion of a BSE signal to a source signal when tonality is high and to minimize IMD by increasing a portion of a source signal to a BSE signal when tonality is low.

A first multiplier 708 may multiply the BSE signal $BSE^{(m)}(t)$ by the gain adjustment value $g_b^{(m)}(t)$. A signal obtained by multiplying the BSE signal $BSE^{(m)}(t)$ and the gain adjustment value $g_b^{(m)}(t)$ may be referred to as a weighted BSE signal $wBSE^{(m)}(t)$. The weighted BSE signal $wBSE^{(m)}(t)$ may be calculated for each sub-band.

A second multiplier 710 may multiply the low-frequency signal $ORG^{(m)}(t)$ of the source to signal by the gain adjustment value $g_o^{(m)}(t)$ to generate a weighted source signal $wORG^{(m)}(t)$. The weighted source signal $wORG^{(m)}(t)$ is transferred to a low-frequency beam processor of the post-processor 140 (see FIG. 1).

The above-described processing on the low-frequency signal $ORG^{(m)}(t)$ and the BSE signal $BSE^{(m)}(t)$ may be expressed below as shown in Equation 8.

$$\begin{aligned} OUT^{(m)}(t) &= ORG^{(m)}(t)\times(1-SFM^{(m)}(t)) + \\ &\quad BSE^{(m)}(t)\times\frac{G_{org}^{(m)}(t)}{G_{bse}^{(m)}(t)}\times SFM^{(m)}(t) \\ &= ORG^{(m)}(t)\times g_0^{(m)}(t) + BSE^{(m)}(t)\times g_b^{(m)}(t) \\ &= wORG^{(m)}(t) + wBSE^{(m)}(t) \end{aligned} \tag{8}$$

A summer 712 may sum the wBSE signals for the sub-bands to generate a summed signal tBSE(t). Because the summed signal tBSE(t) is positioned in the same frequency band as high-frequency components, the summed signal tBSE(t) may become inaudible due to a masking effect. The masking effect, which is a characteristic of the human ear, causes certain sounds to influence the sound of peripheral frequency components. That is, the masking effect refers to a phenomenon where a minimum audible level is increased due to interference from masking sound, thus making certain sounds inaudible.

In order to calculate an amplification factor $g_t(t)$ of the summed signal tBSE(t), loudness of the summed signal tBSE (t) and a high-frequency signal $HP^{(m)}(t)$ are analyzed.

A loudness detector 714 may detect loudness $g_{tbse}(t)$ of the summed signal tBSE(t). Also, a masking level detector 716 may analyze a sound volume of the high-frequency signal $HP^{(m)}(t)$ to calculate its masking level $g_{msk}(t)$.

In order to prevent the BSE signal from becoming inaudible due to the masking effect, a control gain processor 718 may set an amplification factor $g_t$ such that a level of the summed signal tBSE(t) is higher than a masking level of the high-frequency signal $HP^{(m)})(t)$. The amplification factor $g_t$ may be calculated using Equation 9 as shown below.

$$g_t = \frac{\sqrt{g_{tbse}^2 + g_{msk}^2}}{g_{tbse}} \tag{9}$$

A summer 722 may sum the amplified BSE signal and the high frequency signal $HP^{(m)}(t)$ to generate a summed high-frequency signal.

Figure 8A:
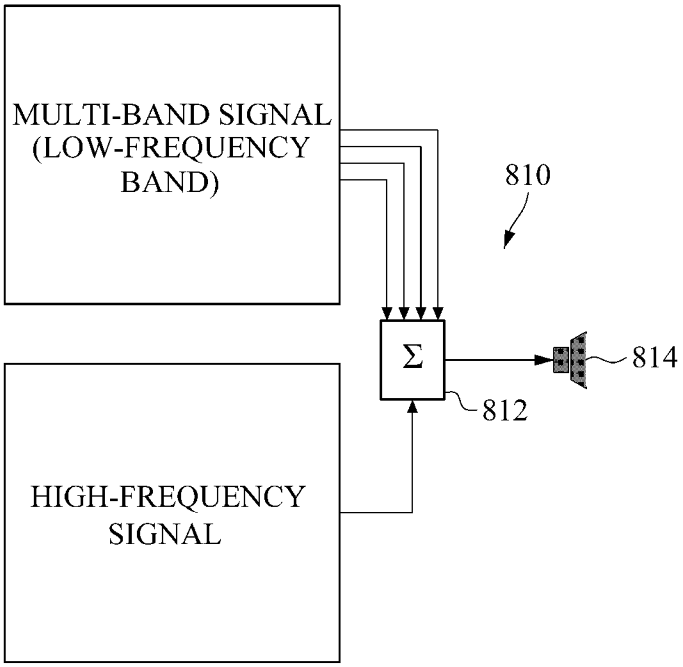
FIGS. 8A, 8B, and 8C are diagrams illustrating examples of a postprocessor that may be included in the sound enhancement apparatus illustrated in FIG. 1.
Figure 8B:
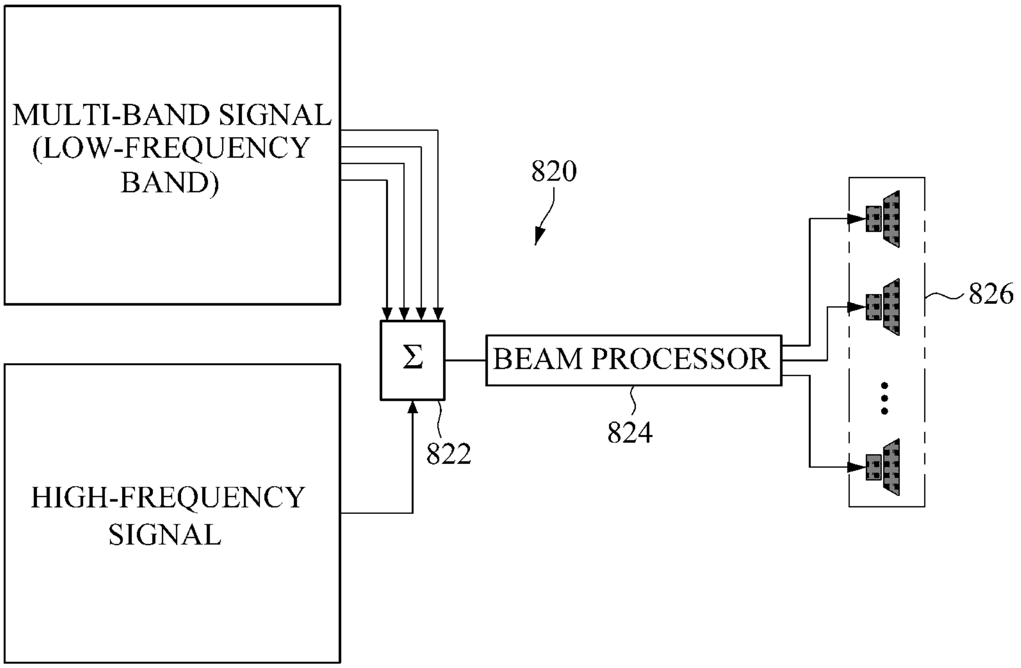
Figure 8C:
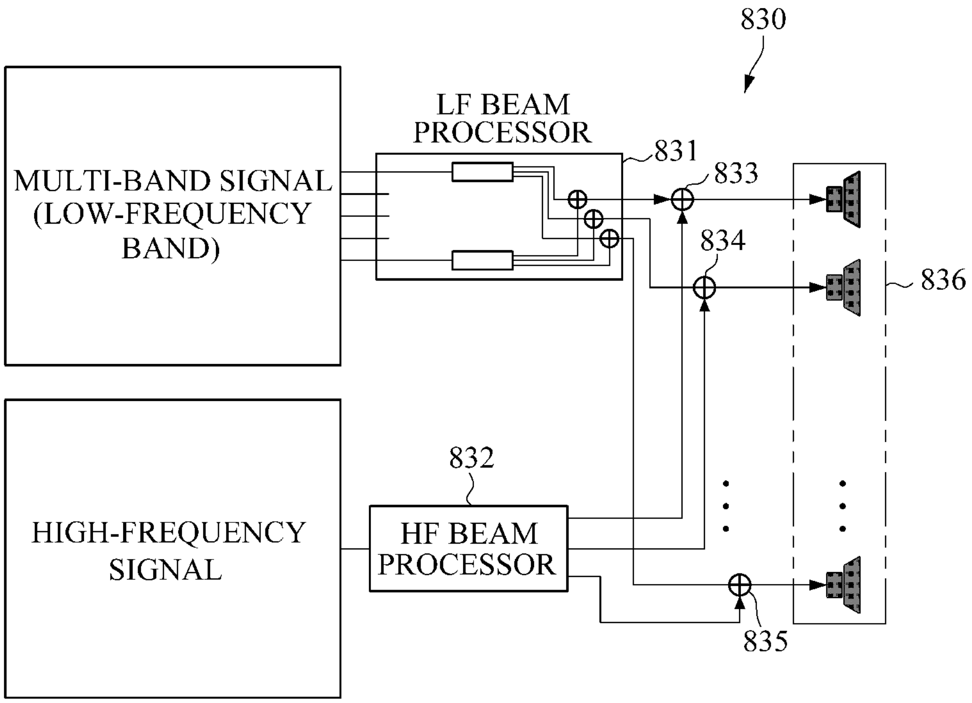

FIGS. 8A, 8B, and 8C illustrate examples of a postprocessor that may be included in the sound enhancement apparatus illustrated in FIG. 1.

Postprocessor 140 may output generated multi-band low-frequency signals and high-frequency signals to at least one loudspeaker to generate sound waves. The postprocessor 140 may be implemented with various configurations. Example configurations 810, 820, and 830 are illustrated in FIGS. 8A, 8B, and 8C, respectively.

Referring to the example shown in FIG. 8A, a postprocessor 810 includes a summer 812 and a speaker 814. The summer 812 may synthesize a multi-band signal in a low-frequency band with a signal in a high-frequency band and output the synthesized signal through the speaker 814.

Referring to the example shown in FIG. 8B, a postprocessor 820 includes a summer 822, a beam processor 824, and a speaker array 826. The summer 822 may synthesize a multi-band signal in a low-frequency band with a signal in a high-frequency band. When the synthesized signal is output the beam processor 824 may process the synthesized signal to form a radiation pattern. The speaker array 816 may output the synthesized signal to generate a sound beam.

Referring to the example shown in FIG. 8C, a postprocessor 830 includes a low-frequency band beam processor 831, a high-frequency band beam processor 832, a plurality of summers 833, 834, and 835, and a speaker array 836. The low-frequency band beam processor 831 may pass sub-band signals respectively through beam processors prepared for the individual sub-bands. The resultant multi-channel signals passing through the beam processors are summed over each of the frequency bands of a low-frequency region and then output. The low-frequency band beam processor 831 may include a plurality of summers for summing signals over all each frequency band, and the number of the summers may correspond to the number of output channels of the speaker array 836.

The high-frequency band beam processor 832 may apply beam forming to high-frequency signals. A plurality of summers 833, 834, and 835 may sum the multi-channel signals output from the low-frequency band beam processor 831 with high-frequency band signals, respectively. The number of the summers 833, 834, and 835 may correspond to the number of the output channels of the speaker array 836.

Figure 9:
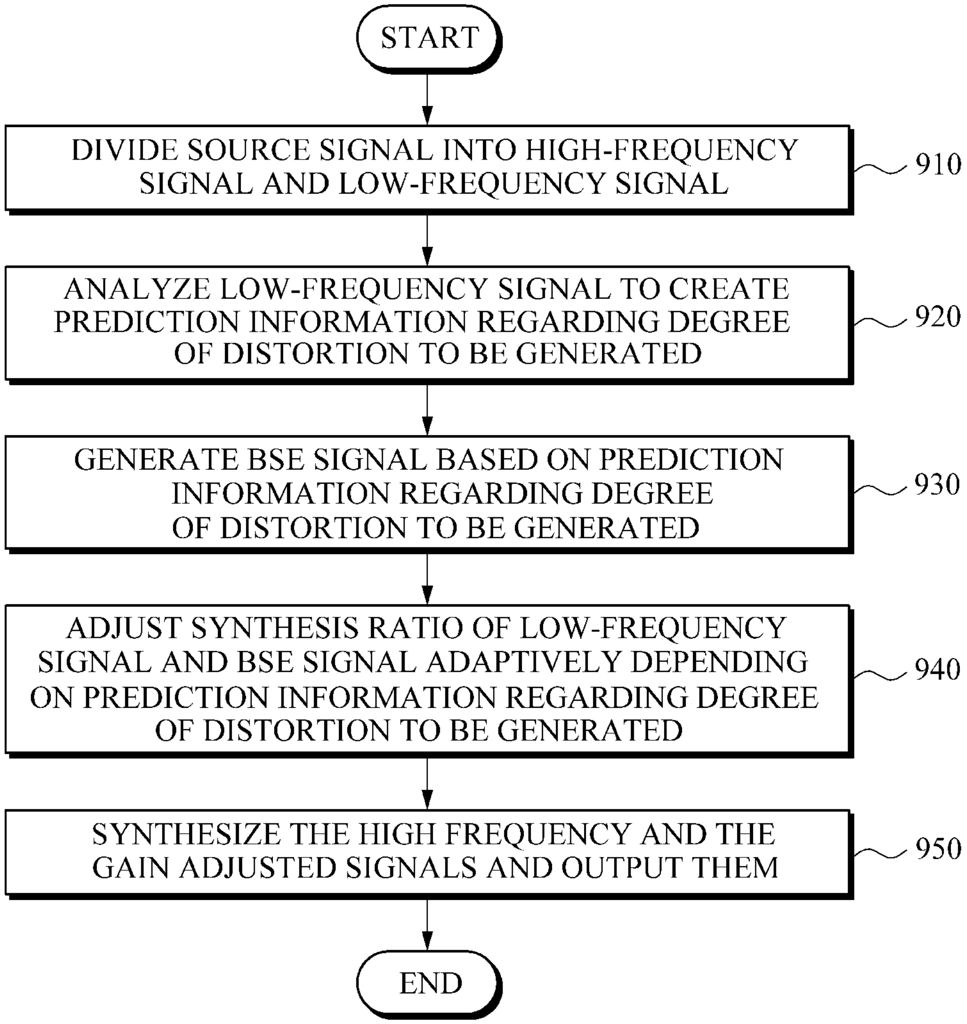
FIG. 9 is a flowchart illustrating an example of a sound enhancement method.

FIG. 9 illustrates an example of a sound enhancement method. The sound enhancement method may be performed by the sound enhancement apparatus 100 that is illustrated in FIG. 1.

In 910, a source signal may be divided into a high-frequency signal and a low-frequency signal. Then, the low-frequency signal may be classified according to sub-bands, and prediction information regarding a predicted degree of distortion may be generated for each sub-band signal. Each sub-band signal may be created in units of frames.

In 920, the low-frequency signal is analyzed, and prediction information regarding a predicted degree of distortion may be generated for the low-frequency signal. For example, the prediction information regarding a degree of distortion may contain tonality information and/or envelope information for each sub-band.

In 930, an order of a higher harmonic signal for the low-frequency signal may be generated as a BSE signal to be substituted for the low-frequency signal, wherein the predetermined order is adjusted based on the prediction information regarding the predicted degree of distortion. In this example, the higher harmonic signal may be created adaptively depending on tonality information by making the amplitudes of the sub-band signals uniform using envelope information to generate a normalized signal and then multiplying the normalized signal by the tonality information. In addition, in order to further reduce IMD, before creating the higher harmonic signal, spectral sharpening may be performed on signals with high tonality components and higher harmonic signals for the spectral-sharpened signals may be generated.

In 940, a synthesis ratio of the low-frequency signal and the BSE signal may be adjusted adaptively depending on the prediction information regarding the predicted degree of distortion. In this example, the synthesis ratio of the low-frequency band signal and the BSE signal may be adjusted based on the tonality information in such a manner as to increase a portion of the low-frequency band signal to the BSE signal when the low-frequency signal has low tonality such that a gain-adjusted signal may be generated. Also, a sound pressure of the BSE signal may be amplified to exceed a masking level of a high-frequency band signal such that loudness of the BSE signal is not masked by the high-frequency band signal.

In 950, the gain-adjusted signal and the high-frequency signal may be synthesized and output. The synthesized signal may form a predetermined radiation pattern.

According to the above-described examples, because BSE can be performed over a broad frequency range while reducing IMD, low-frequency components over a frequency range that is broader than what may be processed by general subwoofers may be substituted with high-frequency components. Because low-frequency signals of a broad frequency region may be substituted with BSE signals, various compact, slimline loudspeakers which output a narrow frequency range may offer a more sufficient auditory sense to a user. The slimline loudspeakers may be included in a terminal device such as a mobile phone, a personal computer, a digital camera, and the like.

Also, by adjusting a ratio of bass components of a source sound to a BSE signal adaptively depending on a degree of IMD to be generated upon processing BSE signals, the effect of BSE can be maximized for each frame of signal while minimizing the deterioration of a quality of sound and low-frequency signals may be implemented as sound natural to the human ears according to their sound characteristics. In addition, BSE signals with low IMD may be generated through multi-band processing and spectral sharpening. Upon forming beams for the processed signals, sound in a low-frequency band with a relatively larger beam width may be converted into sound in a high-frequency band with a relatively low beam width. Accordingly, a sound pressure difference sufficient to be applied to an indoor environment may be ensured without having to increase the size of a speaker array.

As a non-exhaustive illustration only, the terminal device described herein may refer to mobile devices such as a cellular phone, a personal digital assistant (PDA), a digital camera, a portable game console, an MP3 player, a portable/personal multimedia player (PMP), a handheld e-book, a portable lab-top personal computer (PC), a global positioning system (GPS) navigation, and devices such as a desktop PC, a high definition television (HDTV), an optical disc player, a setup box, and the like, capable of wireless communication or network communication consistent with that disclosed herein.

A computing system or a computer may include a microprocessor that is electrically connected with a bus, a user interface, and a memory controller. It may further include a flash memory device. The flash memory device may store N-bit data via the memory controller. The N-bit data is processed or will be processed by the microprocessor and N may be 1 or an integer greater than 1. Where the computing system or computer is a mobile apparatus, a battery may be additionally provided to supply operation voltage of the computing system or computer.

It should be apparent to those of ordinary skill in the art that the computing system or computer may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

The methods described above may be recorded, stored, or fixed in one or more computer-readable storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable storage medium may be distributed among computer systems connected through a network and computer-readable codes or program instructions may be stored and executed in a decentralized manner.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A sound enhancement apparatus comprising:

a processor to divide a source signal into a high-frequency signal and a low-frequency signal and to analyze the low-frequency signal to obtain prediction information regarding a degree of distortion that will be generated by the low-frequency signal;

a Psychoacoustic Bass Enhancement (BSE) signal generator to generate a higher harmonic signal for the low-frequency signal as a BSE signal to be substituted for the low-frequency signal, wherein an order of the higher harmonic signal is adjusted based on the prediction information regarding the degree of distortion; and a gain controller to adjust a synthesis ratio of the low-frequency signal and the BSE signal adaptively based on the prediction information regarding the degree of distortion.

2. The sound enhancement apparatus of claim 1, wherein the processor classifies the low-frequency signal according to a plurality of sub-bands, and obtains the prediction information regarding a degree of distortion that will be generated by a signal corresponding to each sub-band.

3. The sound enhancement apparatus of claim 2, wherein the prediction information regarding the degree of distortion includes tonality information and envelope information.

4. The sound enhancement apparatus of claim 3, wherein the BSE signal generator adjusts the amplitudes of signals corresponding to the sub-bands to be uniform using the envelope information to generate a normalized signal, and generates a higher harmonic signal as the BSE signal for the normalized signal adaptively based on the tonality information.

5. The sound enhancement apparatus of claim 4, wherein the BSE signal generator comprises:

a first adjusting unit to adjust the amplitudes of the signals corresponding to the sub-bands to be uniform using the envelope information, to generate the normalized signal;

a second adjusting unit to multiply the normalized signal by the tonality information; and a non-linear device to generate a higher harmonic signal as the BSE signal for the signal multiplied by the tonality information.

6. The sound enhancement apparatus of claim 5, further comprising a spectral sharpening unit to perform spectral sharpening on a signal with high tonality from among signals output from the second adjusting unit, wherein the non-linear device generates a higher harmonic signal for the spectral-sharpened signal.

7. The sound enhancement apparatus of claim 3, wherein if the low-frequency signal is determined to have low tonality based on the tonality information, the gain controller adjusts the synthesis ratio of the low-frequency signal to the BSE signal such that a portion of the low-frequency signal is larger than that of the BSE signal, thus generating a gain-adjusted signal.

8. The sound enhancement apparatus of claim 7, wherein the gain controller amplifies a sound pressure of the BSE signal to be above a masking level of the high-frequency signal such that loudness of the BSE signal is not masked by the high-frequency signal.

9. The sound enhancement apparatus of claim 1, further comprising a postprocessor to synthesize the high-frequency signal with the gain-adjusted signal.

10. The sound enhancement apparatus of claim 9, wherein the postprocessor comprises:

a beam former to process the synthesized signal to form a radiation pattern when the synthesized signal is output; and a speaker array to output the processed signal.

11. The sound enhancement apparatus of claim 1, wherein the processor analyzes the low-frequency signal prior to a non-linear process being applied to the low-frequency signal, to obtain the prediction information regarding the degree of distortion that will be generated by the low-frequency signal.

12. The sound enhancement apparatus of claim 1, wherein the prediction information comprises a predicted degree of distortion that will be generated from the low-frequency signal if a non-linear operation were to be performed on the low-frequency signal.

13. The sound enhancement apparatus of claim 1, wherein the prediction information comprises a predicted degree of inter-modulation distortion (IMD) that will be caused by non-harmonic frequency components.

14. A sound enhancement method comprising:

dividing a source signal into a high-frequency signal and a low-frequency signal and analyzing the low-frequency signal to obtain prediction information regarding a degree of distortion that will be generated by the low-frequency signal;

generating a higher harmonic signal for the low-frequency signal as a Psychoacoustic Bass Enhancement (BSE) signal to be substituted for the low-frequency signal, wherein an order of the higher harmonic signal is adjusted based on the prediction information regarding the degree of distortion; and adjusting a synthesis ratio of the low-frequency signal and the BSE signal adaptively depending on the prediction information regarding the degree of distortion.

15. The sound enhancement method of claim 14, wherein the generating of the prediction information regarding the degree of distortion comprises:

classifying the low-frequency signal according to a plurality of sub-bands; and obtaining prediction information regarding a degree of distortion that will be generated by a signal corresponding to each sub-band.

16. The sound enhancement method of claim 15, wherein the prediction information regarding the degree of distortion includes tonality information and envelope information.

17. The sound enhancement method of claim 16, wherein the generating of the order of the higher harmonic signal comprises:

adjusting amplitudes of signals corresponding to the sub-bands to be uniform using the envelope information, to generate a normalized signal; and generating a higher harmonic signal for the normalized signal adaptively depending on the tonality information.

18. The sound enhancement method of claim 17, wherein the generating of the higher harmonic signal for the normalized signal adaptively depending on the tonality information comprises:

multiplying the normalized signal by the tonality information;

performing spectral sharpening on a signal with high tonality from among signals multiplied by the tonality information; and generating a higher harmonic signal for the spectral-sharpened signal as the BSE signal.

19. The sound enhancement method of claim 16, wherein if the low-frequency signal is determined to have low tonality based on the tonality information, the adjusting of the synthesis ratio of the low-frequency signal and the BSE signal comprises adjusting the synthesis ratio of the low-frequency signal to the BSE signal such that a portion of the low-frequency signal is larger than that of the BSE signal, thus generating a gain-adjusted signal.

20. The sound enhancement method of claim 19, wherein the adjusting of the synthesis ratio of the low-frequency signal and the BSE signal further comprises amplifying a sound pressure of the BSE signal to exceed a masking level of the high-frequency signal such that the BSE signal is not masked by the high-frequency signal.

21. The sound enhancement method of claim 14, further comprising synthesizing the high-frequency signal with the gain-adjusted signal.

22. The sound enhancement method of claim 21, wherein the synthesizing of the high-frequency signal with the gain-adjusted signal further comprises processing the synthesized signal to form a predetermined radiation pattern when the synthesized signal is output.

23. A sound processing apparatus comprising:

a processor to divide a source signal into a high-frequency signal and low-frequency signal and to obtain prediction information that includes a predicted degree of distortion that will be generated by the low-frequency signal;

an adaptive harmonic signal generator to generate a higher harmonic signal in substitution of a portion of the low-frequency signal based on the predicted degree of distortion of the low-frequency signal; and a gain controller to adjust a conversion ratio of the portion of the low-frequency signal into the higher harmonic signal adaptively to reduce an unequal amount of harmonics, and to generate a gain-adjusted low-frequency signal.

24. The sound processing apparatus of claim 23, wherein the processor comprises a low-pass filter, a multi-band splitter, and a distortion prediction information extractor.

25. The sound processing apparatus of claim 24, wherein the multi-band splitter divides the low-frequency signal into a plurality of sub-bands and the distortion prediction information extractor obtains distortion prediction information for each of the sub-bands.

26. The sound processing apparatus of claim 24, wherein the distortion prediction information extractor obtains tonality and envelope information for each of the sub-bands.

27. The sound processing apparatus of claim 23, wherein the adaptive harmonic signal generator generates a higher harmonic signal by adjusting an order of the higher harmonic signal based on the predicted degree of distortion of the low-frequency signal.

28. The sound processing apparatus of claim 23, wherein the gain controller adjusts a synthesis ratio of the low-frequency signal and the generated higher harmonic signal adaptively, based on the predicted degree of distortion of the low-frequency signal.

29. The sound processing apparatus of claim 23, wherein the gain controller comprises a gain processor to adjust a synthesis ratio of a low-frequency signal and the generated higher harmonic signal, adaptively.

30. The sound processing apparatus of claim 29, wherein the gain processor adjusts a synthesis ratio of a low-frequency signal and the generated higher harmonic signal, adaptively, based on the tonality information.

31. The sound processing apparatus of claim 29, wherein the gain controller further comprises another gain processor to adjust a gain of the higher harmonic signal depending on the characteristics of a high-frequency signal.

32. The sound processing apparatus of claim 23, further comprising another processor to output the high-frequency signal with the synthesized the low-frequency signal and the generated higher harmonic signal.

33. The sound processing apparatus of claim 32, wherein the processor comprises:

a beam former to process the synthesized signal to form a radiation pattern when the synthesized signal is output; and a speaker array to output the processed signal.

34. A sound processing apparatus comprising:

a processor to classify a source signal into a high frequency signal and a low frequency signal, to divide the low frequency signal into a plurality of low-frequency sub-bands, and to obtain prediction information that includes a predicted degree of distortion that will be generated by each low-frequency sub-band based on a non-linear operation to be performed on each low-frequency sub-band;

an adaptive harmonic signal generator to generate a higher harmonic signal in substitution of each low-frequency sub-band based on the predicted degree of distortion of the low-frequency signal to generate a higher harmonic signal; and a gain controller to adjust a synthesis ratio of the low-frequency signal into the higher harmonic signal adaptively to reduce an unequal amount of harmonics, and to generate a gain-adjusted low-frequency signal.

* * * * *